United States Patent [19]
Fathi et al.

[11] Patent Number: 5,750,968
[45] Date of Patent: May 12, 1998

[54] SYSTEM AND APPARATUS FOR REDUCING ARCING AND LOCALIZED HEATING DURING MICROWAVE PROCESSING

[75] Inventors: Zakaryae Fathi, Cary; Richard S. Gerard, Chapel Hill; Jianghua Wei, Raleigh, all of N.C.

[73] Assignee: Lambda Technologies, Inc., Raleigh, N.C.

[21] Appl. No.: 497,603

[22] Filed: Jun. 30, 1995

[51] Int. Cl.$^6$ .................................................. H05B 6/80
[52] U.S. Cl. ..................... 219/736; 219/756; 219/759; 219/762; 219/679; 361/220; 361/816; 174/35 R; 206/710
[58] Field of Search ................ 219/679, 678, 219/736, 738, 759, 762, 756; 361/212, 220, 816; 206/701, 706, 709, 710, 719, 720, 721; 174/35 R

[56] References Cited

U.S. PATENT DOCUMENTS

| | | | |
|---|---|---|---|
| 3,611,135 | 10/1971 | Margerum | 324/85 |
| 3,619,252 | 11/1971 | Roscher | 117/66 |
| 4,144,468 | 3/1979 | Mourier | 310/72 |
| 4,196,332 | 4/1980 | MacKay et al. | 219/10.55 |
| 4,340,796 | 7/1982 | Yamaguchi et al. | 219/10.55 |
| 4,415,789 | 11/1983 | Nobue et al. | 219/10.55 |
| 4,490,183 | 12/1984 | Scovell | 219/679 |
| 4,504,718 | 3/1985 | Okatsuka et al. | 219/10.55 |
| 4,593,167 | 6/1986 | Nilssen | 219/10.55 |
| 4,722,025 | 1/1988 | Robinson | 361/212 |

(List continued on next page.)

FOREIGN PATENT DOCUMENTS

| | | |
|---|---|---|
| 0073250 | 2/1982 | European Pat. Off. . |
| 0250159B1 | 6/1987 | European Pat. Off. . |
| 63-006763 | 1/1988 | Japan . |

OTHER PUBLICATIONS

Bible et al. Multikilowatt Variable Frequency Microwave Furnace; *Mat. Res. Soc. Symp. Proc.*; vol. 269 (Apr. 1992).
Lauf et al.; Materials Processing Usign a Variable Frequency Microwave Furnace; *The American Ceramic Society*; pp. 571–579 (Apr. 1993).
Lauf et al.; Polymer Curing In a Variable Frequency Microwave Oven; *Ceramic Transactions*; pp. 150–155 (Jul. 1993).
Feinstein et al.; *UHF and Microwave Devices*: Section 9.
Johnson et al.; Use of a Variable Frequency Microwave Furnace for Large–Area, Uniform Processing; *American Ceramic Society*; pp. 563–384; (Apr. 1993).
Johnson et al.; Effect of Bandwith on Uniformity of Energy Distribution In a Multi–Mode Cavity; *MRS*; (Apr. 1994).
Johnson et al.; Use of Variable Frequency Microwave Energy As a Flexible Plasma Tool; *MRS* (Apr. 1994).
Rudder et al.; Diamond Chemical Vapor Deposition (CVD) Via Microwave–Excited Plasma From Water–Ethanol Solutions; *The American Ceramic Society*; pp. 377–384 (Apr. 1993).
International Search Report for PCT/US 96/11043.
J.G. Ameen et al.; Microwave Heating of Electric Components *IBM Technical Disclosure Bulletin* 22, No. 9:3393 (1980).

*Primary Examiner*—Philip H. Leung
*Attorney, Agent, or Firm*—Myers Bigel Sibley & Sajovet, L.L.P.

[57] ABSTRACT

A system and apparatus for reducing arcing and localized heating as a result of applying microwave energy to a microelectronic substrate having electronic components thereon is provided. A microwave furnace having a chamber is configured to secure a microelectronic substrate therewithin. The microelectronic substrate is electrically interconnected with a ground connected to an interior wall of the microwave furnace. A holder for securing a microelectronic substrate during the application of microwave energy and for providing the necessary electrical connections for grounding components and circuitry thereon is also provided. The holder may have a heat sink for protection against heat build-up and for maintaining a microelectronic substrate in a substantially flat orientation during microwave processing.

14 Claims, 6 Drawing Sheets

U.S. PATENT DOCUMENTS

| | | | |
|---|---|---|---|
| 4,825,028 | 4/1989 | Smith | 219/10.55 |
| 4,843,202 | 6/1989 | Smith | 219/10.55 |
| 4,866,344 | 9/1989 | Ross et al. | 315/3.5 |
| 4,881,642 | 11/1989 | Adam | 206/709 |
| 4,939,331 | 7/1990 | Berggren et al. | 219/10.55 |
| 4,985,607 | 1/1991 | Oya | 219/762 |
| 5,142,352 | 8/1992 | Chambers et al. | 257/704 |
| 5,241,040 | 8/1993 | Cuomo et al. | 528/353 |
| 5,290,993 | 3/1994 | Kaji et al. | 219/121.43 |
| 5,296,271 | 3/1994 | Swirbel et al. | 427/493 |
| 5,317,045 | 5/1994 | Clark, Jr. et al. | 523/300 |
| 5,317,081 | 5/1994 | Gelorme et al. | 528/353 |
| 5,321,222 | 6/1994 | Bible et al. | 219/745 |
| 5,417,494 | 5/1995 | Kempa et al. | 219/711 |
| 5,599,499 | 2/1997 | Held et al. | 219/762 |

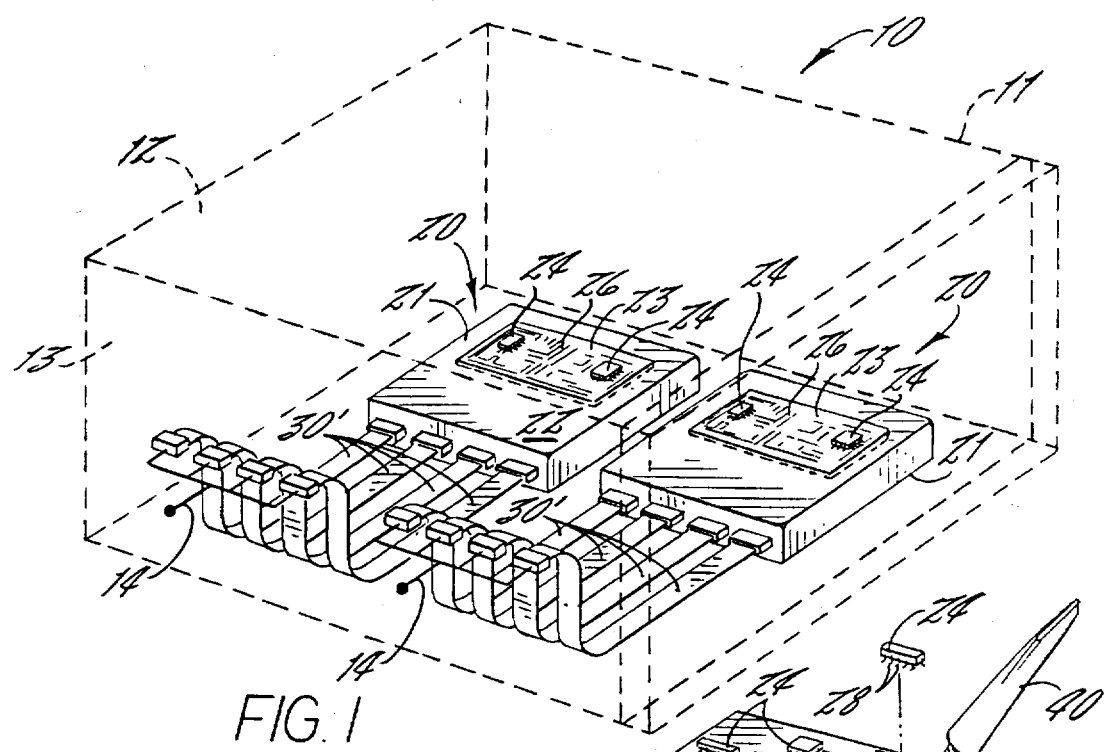
FIG. 1
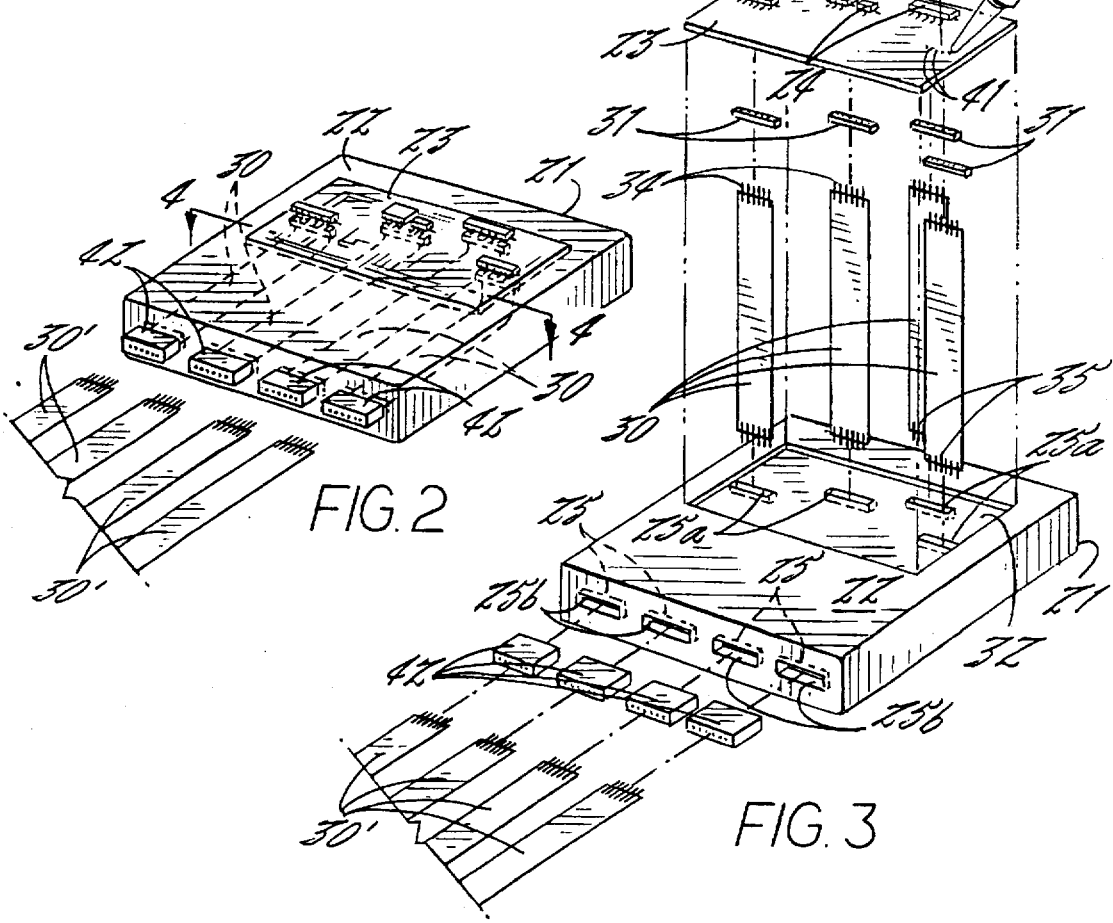
FIG. 2
FIG. 3

SYSTEM AND APPARATUS FOR REDUCING ARCING AND LOCALIZED HEATING DURING MICROWAVE PROCESSING

FIELD OF THE INVENTION

The present invention relates generally to microwave energy, and more particularly to reducing arcing and localized heating caused by the application of microwave energy.

BACKGROUND OF THE INVENTION

Assembling microelectronics often comprises mounting various electronic components (e.g., transistors, capacitors, resistors, semi-conductor components, etc.) on a microelectronic substrate (e.g., a rigid or flexible circuit board). Often, these substrates are, in turn, mounted on, or connected to, other components and devices. For various reasons, traditional mounting methods utilizing lead-based solder have become less desirable. Increasingly common now are the use of conductive polymeric adhesives to mount electronic components on microelectronic substrates, and non-conductive polymeric adhesives to connect various components and devices.

In general, an uncured conductive adhesive is applied to a microelectronic substrate so that, when placed within the adhesive, the electronic component is connected to the underlying circuitry. After the electronic component is placed in the adhesive, the adhesive is cured to securely connect the component to the substrate. Similarly, an uncured non-conductive adhesive may be applied to a microelectronic substrate, the substrate placed on another component or device, and the adhesive cured to securely connect the substrate to the component.

Various methods of curing polymers are known. These methods typically comprise the application of heat by various techniques. Other methods include the addition of curing agents, with or without heat. The general use of microwave irradiation is becoming more common. For example, U.S. Pat. No. 5,317,045 to Clark, Jr. et al., relates to a method of curing a polymeric material using microwave energy. The advantage of curing polymeric resin with microwave energy is that the time required to cure is less than the time required using conventional methods. This is because the volumetric deposition of microwave energy is more efficient than conduction from the surface resulting from conventional heating techniques. See, for example, *Polymer Curing In A Variable Frequency Microwave Oven*, R. J. Lauf et al., Oakridge National Laboratory. See also, U.S. Pat. No. 5,296,271 to Swirbel et al., which discloses a method of curing photoreactive polymers by exposing them to microwave energy.

Unfortunately, when microwave energy is applied to a microelectronic substrate, arcing and/or rapid accumulation of heat may occur which may cause localized damage to the circuit board, to the component being mounted to the circuit board, or to both. In general, metallic components that are exposed to microwaves will arc or experience excessive heat accumulation unless grounded. Arcing results from the buildup of a differential charge between different components or between one or more of the electronic components and the interior walls of the microwave chamber. When the difference in potential exceeds the resistance of a dielectric medium, such as air, the result is a release of the built-up charge through the dielectric medium, physically manifested by an arc between two oppositely charged components.

Additionally, when microwave energy is applied to a microelectronic substrate comprising circuitry, localized heating of selected areas of the substrate may result. Selective portions of the conductive circuitry may heat more rapidly than other portions, resulting in damage to that portion of the circuitry. Furthermore, microelectronic components are typically comprised of a plurality of materials, each of which may respond differently to the application of microwave energy. Some materials may heat more rapidly than others, resulting in damage to that portion of the component.

A microelectronic substrate may typically comprise a plurality of microelectronic components bonded thereto using different polymers and resins. Because of the different types of materials comprising the components, their different geometries, and their configuration relative to one another, curing times may vary from one portion of the substrate to another. Unfortunately, the processing time for a substrate is dependent on the time required to cure the slowest component/resin configuration.

SUMMARY OF THE INVENTION

It is therefore an object of the present invention to reduce arcing resulting from microwave processing of microelectronic substrates.

It is another object of the present invention to reduce localized heating resulting from microwave processing of microelectronic substrates.

It is yet another object of the present invention to provide improved curing times of conductive and non-conductive polymeric adhesives through a combination of convection heating and microwave energy.

These and other objects are provided, according to the present invention, by a system and apparatus for microwave processing of a microelectronic substrate which reduces arcing and localized heating that may occur when the substrate and components thereon are exposed to microwave energy. The system comprises a chamber including a microwave energy generator; securing means for holding a microelectronic substrate within the chamber; and electrical means for electrically interconnecting the microelectronic substrate with an interior wall of the microwave chamber so as to ground the substrate and components thereon. The apparatus comprises a holder for securing a microelectronic substrate during the application of microwave energy, for providing the necessary electrical connections for grounding the microelectronic substrate and components contained thereon, and for alleviating the localized accumulation of heat during microwave processing.

In particular, the holder comprises a substantially microwave-transparent base to which a microelectronic substrate can be removably secured for microwave processing. Acceptable microwave-transparent materials include ceramics, such as fibrous zirconia, and compositions of silica and alumina. Also acceptable are polymers, including polyethylene, polyamide, and TEFLON® (E. I. DuPont de Nemours Company, Wilmington, Del.). The base includes at least one internal bore sized and configured to receive an electrical conductor. The electrical conductor extending through the bore has a substrate end configured to electrically interconnect the microelectronic substrate and a ground end configured to electrically interconnect with one of the interior walls of the microwave chamber. The bore terminates at a substrate end located to facilitate the connection of the conductor substrate end with the microelectronic substrate. The bore also terminates at a ground end opposite the substrate end to facilitate the connection of the conductor ground end with one of the interior walls of the microwave chamber.

The holder may be configured to secure a plurality of microelectronic substrates, wherein a plurality of internal bores having a plurality of electrical conductors extending through a respective one of the internal bores are provided. Each one of the plurality of electrical conductors has a substrate end configured to electrically interconnect with a respective microelectronic substrate and a ground end configured to electrically interconnect with one of the interior walls of the microwave chamber.

According to another aspect of the invention, a microwave-absorbent mass is positioned on the base so that a predetermined portion of the microelectronic substrate overlies the mass when the microelectronic substrate is secured to the base. Acceptable materials for the microwave-absorbent mass include silicon carbide, ferric oxide, carbon black, copper oxide black and metals in powdered form, such as silver and aluminum. A plurality of microwave-absorbent masses may be positioned on the base so that a respective predetermined portion of the microelectronic substrate overlies each mass when the microelectronic substrate is secured to the base. When microwave energy is applied, the microwave-absorbent mass heats rapidly and produces localized convective heating. Consequently, the cure rate of a polymer located near a microwave-absorbent mass can be increased as a result of the combination of microwave energy and convective heating.

According to another aspect of the invention, a pin having a tip extends from the base so that the tip is in adjacent relationship with a predetermined portion of the microelectronic substrate when the microelectronic substrate is secured to the base. The tip has a ground end opposite from the tip and electrically interconnected with an electrical conductor extending through an internal bore. When the base is subjected to microwave energy, the microwave field is intensified at the tip. Consequently, the cure rate of a polymer located near the tip can be increased as a result of the intensified microwave energy.

A base may further comprise a plurality of pins each of which has a tip and extends from the base so that each tip is in adjacent relationship to a respective predetermined portion of the microelectronic substrate when the microelectronic substrate is secured to said base. Each pin also has a ground end opposite from the tip, electrically interconnected with an electrical conductor extending through an internal bore.

According to another aspect of the invention, the holder may comprise a heat sink designed to protect selective portions of a microelectronic substrate, including components and circuitry thereon, from excessive heat build-up. The heat sink is positioned directly above, and in contact with, the portion of the microelectronic substrate to be protected and is designed to absorb heat caused by microwave processing. The heat sink is comprised of a substantially microwave-transparent material, similar to the base of the holder and has a high specific heat. Because the heat sink material has a high specific heat, heat at the point of contact with the substrate is absorbed by the heat sink. An additional advantage of the heat sink is that it facilitates maintaining an underlying substrate in a substantially flat orientation during microwave processing.

According to another aspect of the invention, a system and apparatus is provided for microwave processing of a workpiece which reduces arcing and localized heating that may occur when the workpiece and any components thereon or therein are exposed to microwave energy. The term "workpiece" is used hereinafter to refer to any object that is exposed to microwave irradiation processing, including, but not limited to, electronic components and substrates (including microelectronic components and substrates). The system comprises a chamber including a microwave energy generator; securing means for holding a workpiece within the chamber; and electrical means for electrically interconnecting the workpiece with an interior wall of the microwave chamber so as to ground the workpiece and components thereon. The apparatus comprises a holder for securing a workpiece during the application of microwave energy, for providing the necessary electrical connections for grounding the workpiece and components contained thereon, and for alleviating the localized accumulation of heat during microwave processing.

BRIEF DESCRIPTION OF THE DRAWINGS

FIG. 1 is a perspective view of a system and apparatus for reducing arcing and localized heating during microwave processing, according to the present invention.

FIG. 2 is a perspective view of a holder assembly, according to the present invention.

FIG. 3 is an exploded perspective view of the holder assembly of FIG. 2.

DETAILED DESCRIPTION OF PREFERRED EMBODIMENTS

Figure 4:
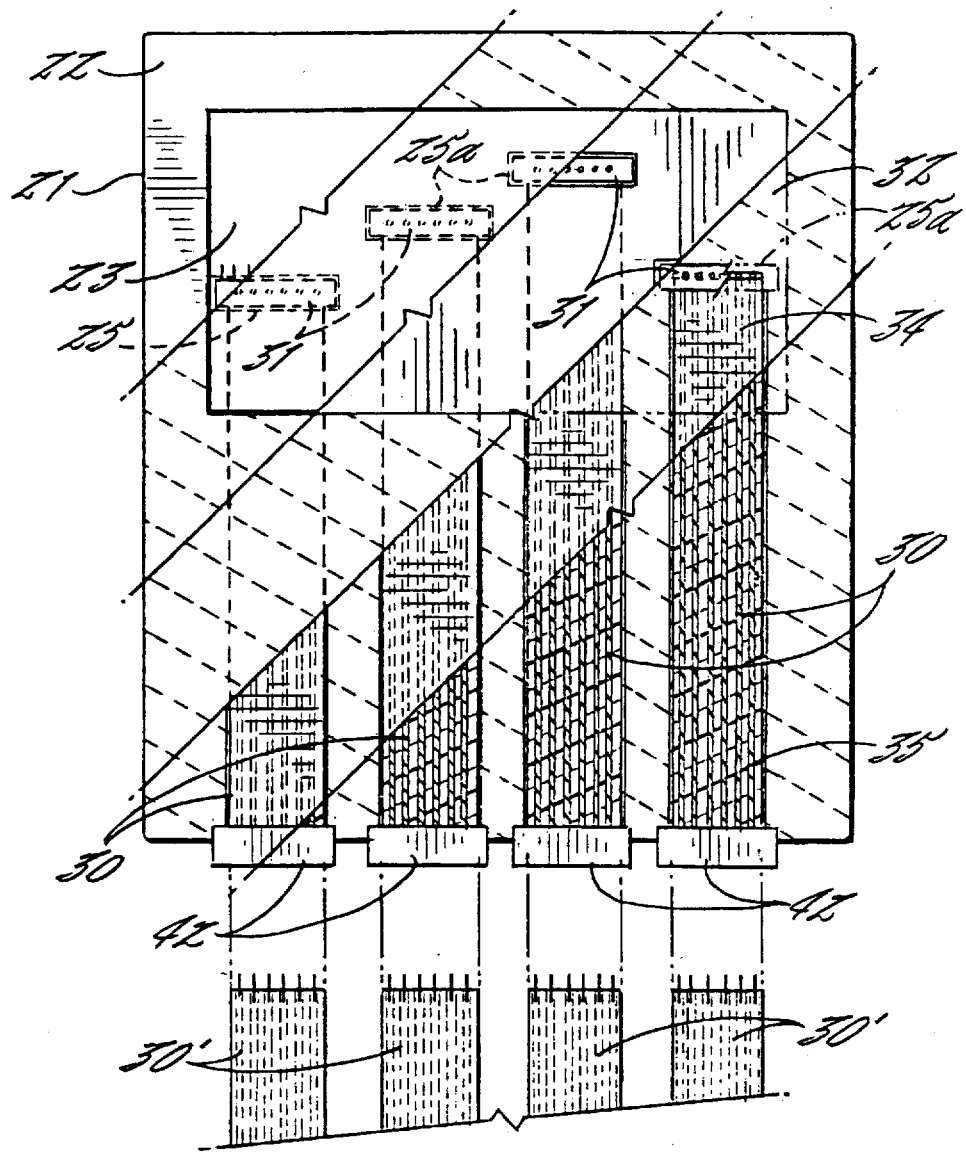
FIG. 4 is a sectional view taken along lines 4—4 in FIG. 2.

The present invention now is described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions may be exaggerated for clarity. Like numbers refer to like elements throughout.

Referring now to FIGS. 1–4, a system for reducing arcing and localized heating during microwave processing of a microelectronic substrate according to the present invention is illustrated. The system 10 comprises a microwave furnace 11 having a chamber 12 defined by a plurality of walls 13; a ground 14 connected to at least one of the interior walls of the microwave chamber; a holder assembly 20 for removably securing a flexible or rigid microelectronic substrate 23 having a plurality of microelectronic components 24 thereon; and a plurality of electrical conductors 30, 30' for connecting the microelectronic substrate 23 to the ground 14. A particularly preferred microwave furnace is described in U.S. Pat. No. 5,321,222, to Bible et al., the disclosure of which is incorporated herein by reference in its entirety.

The present invention is not limited to microwave processing of electronic components and substrates, but is applicable to any and all objects (or "workpieces" as described above) that may be exposed to microwave irradiation processing. The system and apparatus disclosed herein may be used to reduce arcing and localized heating that may occur when the workpiece and any components thereon or therein are exposed to microwave energy.

The holder assembly 20 comprises a substantially microwave-transparent base 21 having a surface 22 for removably receiving and securing a microelectronic substrate 23. The base 21 may include at least one internal bore 25 sized and configured to receive at least one electrical grounding conductor 30 therethrough. The internal bore 25 terminates at two openings: a substrate end opening 25a in the surface 22 upon which the microelectronic substrate 23 is secured, and a ground end opening 25b in another portion of the base 21. As illustrated in FIG. 3, the base 21 may comprise a plurality of internal bores 25, substrate end openings 25a, and ground end openings 25b.

The internal bore 25 in the base 21 is preferably sized and configured to receive a flat, flexible electrical conductor 30. The flexible electrical conductor 30 extends through the internal bore 25 and preferably has a substrate end 34 configured to electrically interconnect with the microelectronic substrate through the substrate end opening 25a. At the opposite end of the electrical conductor 30, a ground end 35 is preferably configured to electrically interconnect with either an additional electrical conductor 30' (FIGS. 1–4) or, as shown in FIG. 5, directly with a ground 14. Preferably, the electrical conductors 30, 30' each comprise a plurality of metallic wires wrapped in a polymeric dielectric material, such as polyamide, adapted at each end to receive various types of connectors 31. However, as would be understood by those having skill in the art, a conductor comprising nonmetallic conductive material, such as screen-printed conductive inks and the like, would also be acceptable. Furthermore, the electrical conductors 30, 30' may each comprise only a single conductive pathway, such as a single wire or single conductive strip of material.

Preferably, the microelectronic substrate 23 is secured within a recessed portion 32 of the base 21. However, as would be understood by those having skill in the art, the base 21 may have any desirable shape and configuration for receiving a microelectronic substrate 23, including having no recessed portion 32, or by having a raised portion (not shown). Additionally, the microelectronic substrate 23 may be removably secured to the base 21 by retaining clips, screws, tape, or other methods known to those having skill in the art. As discussed further below, a flexible microelectronic substrate 23, may be secured to the base 21 and maintained in a substantially flat orientation during microwave processing by positioning a heat sink over the substrate.

Preferably, the base 21 is custom designed and machined for receiving a particular microelectronic substrate 23. The base 21 is preferably made from machinable microwave-transparent materials such as ceramics and polymers. Examples of ceramic material particularly suitable for the base 21 include, but are not limited to, fibrous zirconia, and compositions of silica and alumina. Particularly preferable are porous compositions of silica and alumina having proportions of about 80% alumina and about 20% silica. Examples of polymeric material particularly suitable for the base 21 include, but are not limited to, Teflon®, polyethylene, and polyamide.

Figure 5:
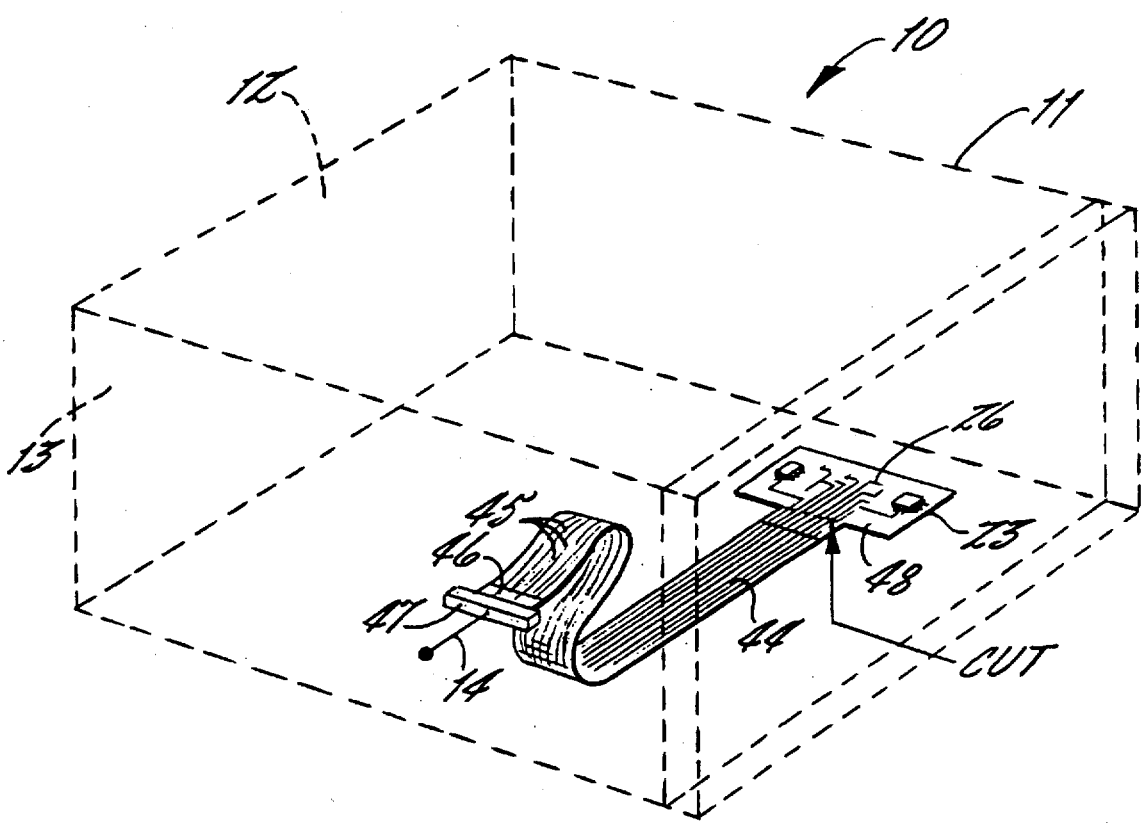
FIG. 5 is a perspective view of another embodiment for reducing arcing and localized heating during microwave processing of a flexible substrate, according to the present invention.

Referring to FIG. 4, substrate end openings 25a are located within the base 21 at predetermined locations in order to properly align with a particular microelectronic substrate 23. At each of the substrate end openings 25a of the internal bores 25, a connector 31 is positioned in close proximity to the recessed area 32 for receiving respective connecting pins (not shown) extending from the microelectronic substrate 23. The connectors 31 are provided to electrically interconnect components 24 and portions of the microelectronic substrate 23 to be protected from arcing and localized heating to a ground 14 via the electrical conductors 30, 30'.

Referring to FIG. 3 a microelectronic substrate 23 having a plurality of microelectronic components 24 is illustrated. Securing a microelectronic component 24 to a microelectronic substrate 23 comprises applying a curable resin 41 to the substrate via an applicator 40, setting the connecting pins 28 of the component in the resin, and curing the resin. As would be understood by those having skill in the art, a microelectronic substrate 23 is a dielectric material having electronic circuitry 26 thereon, to which various microelectronic components 24 are physically and electrically connected. The circuitry 26 on the microelectronic substrate 23 may be screen printed using conductive materials, or may be applied to the substrate by other methods known to those with skill in the art. The microelectronic substrate 23 may be made from flexible or rigid materials. The resin 41 may be conductive or non-conductive depending on the component and where on the circuitry the component is located.

As would be well known to those having skill in the art, traditional methods for mechanically and electrically securing electrical components to circuitry comprised the use of solder. Electrical connecting pins extending from a component were inserted into selective portions of a circuit on an electronic substrate and secured thereto by applying molten solder to the junction of the contact and circuit and allowing it to cool, and thereby harden. According to the present invention, both electrically conductive and non-conductive resins 41 are replacing solder and other traditional methods of securing components to a circuit. The resin 41 is applied to various portions of the circuit where each connecting pin 28 of a component 24 is desired to connect to the circuitry 26. The resin 41 serves to physically secure the component 24 to the substrate 23 and to electrically connect the component to the circuitry 26. Additionally, a non-conductive resin may be used to secure various components to a microelectronic substrate, or to each other, where electrical conductivity is not needed or provided in some other way. Conductive and non-conductive resins may also be used to secure the microelectronic substrate to other objects.

Still referring to FIG. 3, the process of securing microelectronic components 24 to a substrate 23, according to the present invention, may be performed by hand or by automated equipment, typically in assembly-line fashion, and preferably under computer control. Automated applicators 40 may apply resin 41 to predetermined locations of a particular microelectronic substrate 23. Electronic components 24 may then be inserted within the resin by automated equipment. The substrate may then be forwarded to a microwave furnace for curing. Furthermore, the process of securing electronic components to a substrate, according to the present invention, may be part of larger process including the fabrication of the microelectronic substrate and circuitry.

Preferably, each component 24 to be grounded, and each circuit 26 to be grounded has one or more connecting pins or conductors, as required, extending from the microelectronic substrate 23. When the microelectronic substrate 23 is placed on the holder assembly 20, the connecting pins or conductors align with the connectors 31 so that an electrical connection is made between the components 24 or circuit 26 and the ground 14 (FIGS. 3 and 4). As would be understood by those having skill in the art, other ways of electrically connecting a component 24 or portions of a circuit 26 to ground 14 may be utilized. For example, a conductor having one end connected to ground 14 may be directly attached at the other end to a component 24 or circuit 26 via an alligator clip or similar device.

An electrical conductor 30 extends from connector 31 through internal bore 25 to a connector 42 located within the ground end opening 25b of the internal bore. As would be understood by those having skill in the art, electrical conductor 30 may extend further and connect to the ground 14, or may terminate at connector 42 as illustrated in FIG. 4. As illustrated, an additional electrical conductor 30' may extend from connector 42 to a ground 14. In the illustrated embodiment, a plurality of conductors 30 extend through a plurality of internal bores 25 in the base 21 and connect to a ground 14 via a plurality of additional conductors 30'.

As would be known to those having skill in the art, microelectronic substrates are often manufactured with a flexible tail 44 as illustrated in FIG. 5. This configuration of substrate 23 and tail 44 permits the substrate, and components 24 thereon, to be protected from arcing and localized heating without requiring a holder assembly and without requiring additional electrical conductors for grounding. After processing within the microwave furnace 11, the tail 44 may or may not be cut, as indicated in FIG. 5, and removed from the microelectronic substrate 23.

In the illustrated embodiment a microelectronic substrate 23 includes a flexible tail 44 having a plurality of conductive leads 45 extending from the circuitry 26 on the substrate. The tail 44 has an end portion 46 which is connected to the ground 14 via the connector 47. Because of its flexibility and length, the tail 44 can be grounded to any one of the interior walls 13 of the microwave chamber 12. A separate conductor (not shown) may also be utilized to ground the tail 44 without requiring a connector 47. For example, a conductor having one end connected to ground 14 may be directly attached at the other end to a component 24 or circuit 26 via an alligator clip or similar device. Additionally, a plurality of microelectronic substrates 23 having flexible tails 44 can be processed simultaneously within the microwave furnace 11.

Figure 6:
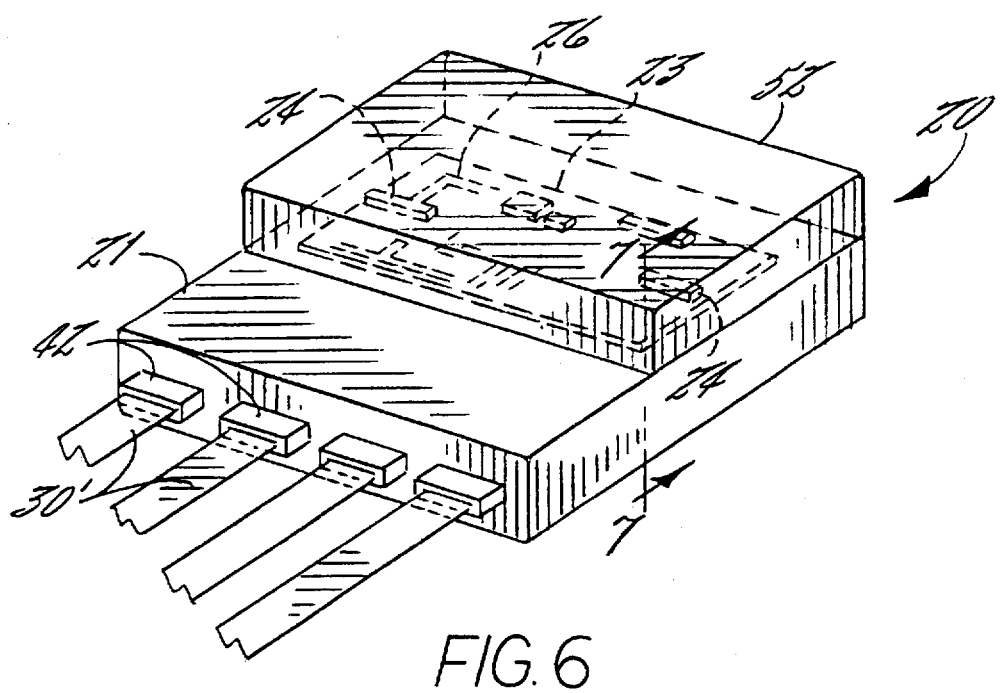
FIG. 6 is a perspective view of a heat sink, according to the present invention.
Figure 7:
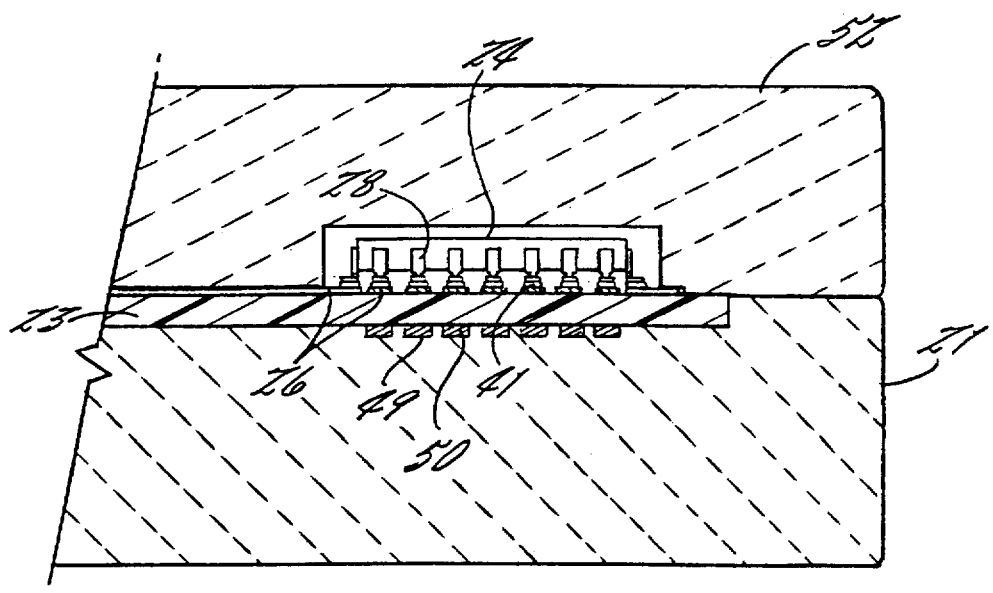
FIG. 7 is a section view of the heat sink taken along lines 7—7 in FIG. 6.
Figure 8:
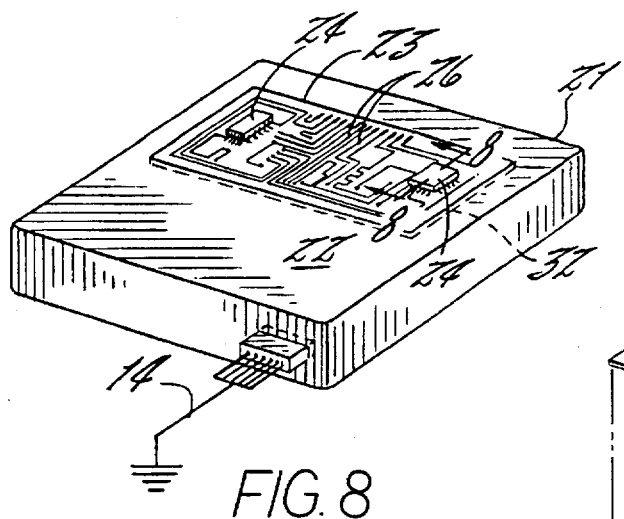
FIGS. 8–11 illustrate the use of microwave-absorbent materials in the holder assembly, according to the present invention.
Figure 9:
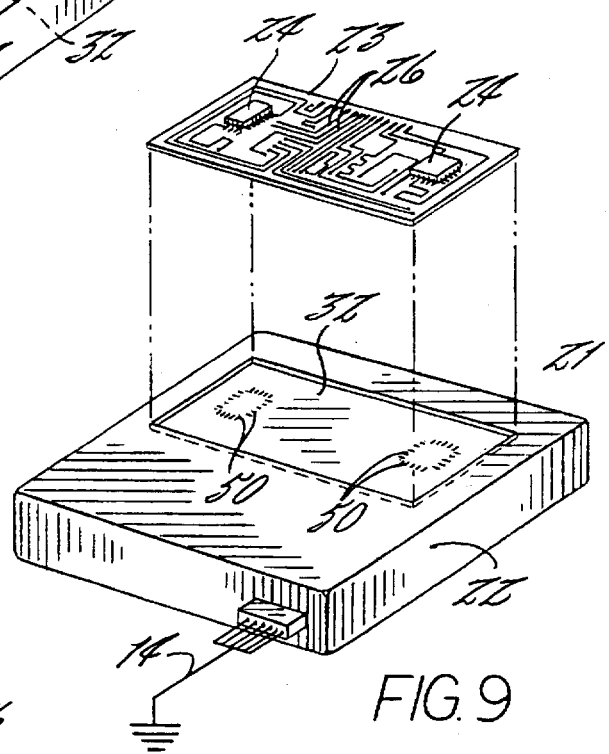
Figure 10:
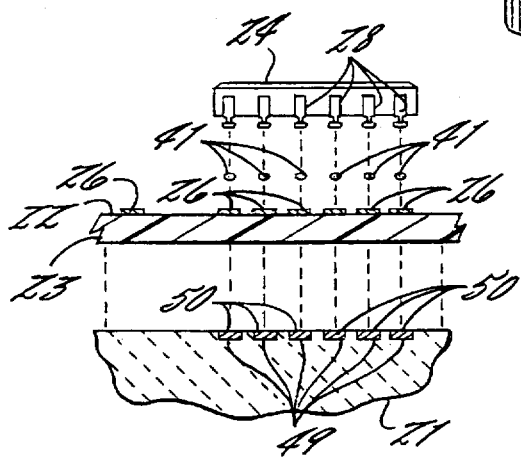
Figure 11:
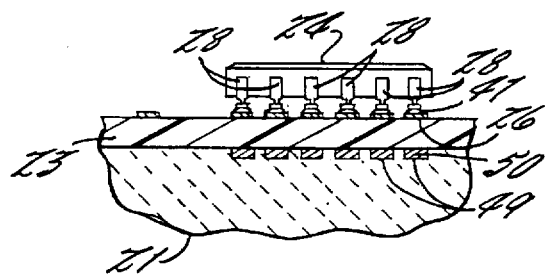

Referring now to FIGS. 6–7, the holder assembly 20 may also comprise a heat sink 52 for protecting portions of the microelectronic substrate 23, including components 24 and circuitry 26 thereon, from the build-up of heat. The heat sink 52 is positioned directly above, and in contact with, the portion of the microelectronic substrate 23 to be protected and is designed to absorb heat caused by microwave processing. Because the heat sink material has a high specific heat, heat at the point of contact with the substrate 23 is absorbed by the heat sink 52. The heat sink 52 is preferably made from machinable microwave-transparent materials such as ceramics and polymers. Examples of ceramic material particularly suitable for the heat sink 52 include, but are not limited to, fibrous zirconia, and compositions of silica and alumina. Particularly preferable are porous compositions of silica and alumina having proportions of about 80% alumina and about 20% silica. Examples of polymeric material particularly suitable for the heat sink 52 include, but are not limited to, Teflon®, polyethylene, and polyamide.

An additional advantage of the heat sink 52 is that it maintains an underlying substrate 23 in a substantially flat orientation during microwave processing. This is especially important when flexible microelectronic substrates are being processed, because any flexing or bending during processing may result in a component not being adequately mounted, or may exacerbate existing stresses caused by different coefficients of thermal expansion of the various connected materials. Furthermore, when a flexible microelectronic substrate is mounted to another object, any flexing or bending during processing that becomes permanent after the resin has cured may result in the microelectronic substrate malfunctioning. The heat sink 52 may be an integral part of the holder assembly 20, or it may be a separate assembly used in conjunction with the holder assembly. Furthermore, the heat sink 52 may be designed to protect a specific microelectronic substrate 23 or a portion thereof.

Referring back to FIG. 5, a heat sink 52 may also be placed on top of a microelectronic substrate 23 that is being processed without a holder 20. Also, as would be known by those having skill in the art, the microelectronic substrate 23 may include a dielectric layer 48 overlying portions of the circuitry 26 thereon. The dielectric layer 48 may serve the function of a heat sink to protect underlying portions of the microelectronic substrate 23 from the build-up of heat. The dielectric layer 48 is typically applied to the microelectronic substrate 23 during manufacturing of the substrate and can be placed thereon to selectively protect portions of the circuitry 26.

According to another embodiment of the present invention, as illustrated in FIGS. 8–11, the recessed area 32 in the base 21 has grooves 49 positioned to correspond with a plurality of predetermined locations on the microelectronic substrate 23 when the substrate is placed on the base. Within each of these grooves 49 is placed a highly conductive microwave absorbing material 50. As would be known to those having skill in the art, suitable highly conductive microwave absorbing materials include, but are not limited to, silicon carbide, ferric oxide, carbon black, and metals in powdered form.

When a microelectronic substrate 23 is placed on the base 21, and microwave energy is applied, the microwave absorbing material 50 within each groove 49 heats to a predetermined temperature and supplies additional convective heating to a localized area of the microelectronic substrate above the microwave absorbing material. The resin 41 contained on the microelectronic substrate 23 directly above the microwave absorbing material is, thus, exposed to both microwave energy and convective heating. As a result, polymers which do not cure as rapidly as other polymers when subjected to a particular frequency of microwave energy, can be forced to cure faster by the combination of convective heating and microwave energy. Thus, in addition to providing the necessary grounding as discussed above, the base 21 may also provide a way to selectively increase the cure rate of polymers that is not achievable with microwave energy alone.

A holder assembly 20 having microwave absorbing materials 50 may be custom designed to fit a specific microelectronic substrate 23. In the illustrated embodiment, the grooves 49 are located within the recessed portion 32. However, as those skilled in the art would understand, the grooves 49 within which the microwave absorbing material 50 is placed may be located on the base 21 at any desirable position, including the surface 22, and any raised portion (not shown) of the base. Alternatively, the microwave absorbing material 50 may be placed directly on the base 21 without requiring grooves. In addition, a heat sink 52 (FIG. 6), as described fully above, may be utilized with the embodiment of the present invention illustrated in FIGS. 8–11 in order to protect portions of the microelectronic substrate 23, including components 24 and circuitry 26 thereon, from heat build-up.

Figure 12:
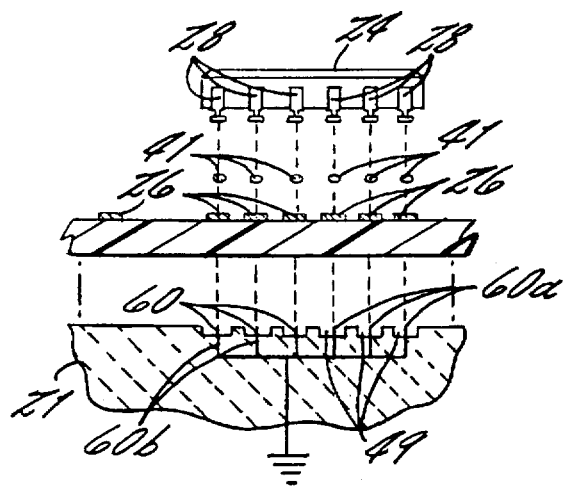
FIGS. 12–13 illustrate the use of pins in the holder assembly for intensifying microwave energy, according to the present invention.
Figure 13:
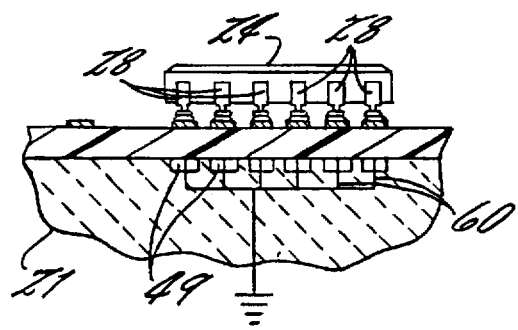

According to another embodiment of the present invention, illustrated in FIGS. 12–13, the rate of cure of certain polymers and resins can be increased by intensifying the microwave energy at specific locations beneath the microelectronic substrate 23. The base 21 may comprise a plurality of pins 60 each having a tip 60a extending from the base 21 so that the tip is in adjacent relationship with a predetermined portion of the overlying microelectronic substrate 23 when placed on the base 21. Preferably the pins 60 point in the direction of the resin 41 to be cured on the overlying substrate 23. The tip 60a of each pin 60 is preferably in close proximity to the overlying microelectronic substrate 23.

In the illustrated embodiment, each pin 60 extends from the base 21 within a groove 49. However, each pin 60 may extend directly from the base 21 without requiring a groove. Each pin 60 has a ground end 60b opposite from the tip 60a and is electrically connected with a grounded electrical conductor 30 to reduce the possibility of arcing between the pin and other objects, including the microelectronic substrate 23, electronic components 24 on the substrate, the electronic circuitry 26, and the microwave chamber walls 13. The electrical conductor 30, to which each pin 60 is electrically connected, preferably extends through an internal bore 25 of the base 21. In addition, a heat sink 52 (FIG. 6), as described fully above, may be utilized with the embodiment of the present invention illustrated in FIGS. 12–13 in order to protect portions of the microelectronic substrate 23, including components 24 and circuitry 26 thereon, from heat build-up.

Each pin 60 is preferably made from a metallic material including, but not limited to, silver, aluminum, and stainless steel. When each pin 60 is subjected to microwave energy, the microwave field is intensified at the tip 60a of the pin, which in turn leads to an increased concentration of microwave energy. The result is an increase in the rate of curing of the resin 41 located directly above each pin 60 on the overlying microelectronic substrate 23.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A system for reducing arcing and localized heating during microwave processing of a microelectronic substrate, said system comprising:

a chamber including means for generating microwave energy;

a substantially microwave-transparent base for removably securing the microelectronic substrate thereto, said base including at least one internal bore sized and configured to receive an electrical conductor, said bore having a substrate end located to provide the electrical conductor to the microelectronic substrate, and a ground end opposite the substrate end for providing the electrical conductor to ground; and an electrical conductor having a substrate end configured to electrically interconnect the microelectronic substrate and a ground end configured to electrically interconnect with a ground connected to said chamber.

2. A system according to claim 1, wherein said base further comprises a plurality of internal bores and a plurality of electrical conductors, each extending through a respective one of said plurality of internal bores and having a substrate end configured to electrically interconnect with the microelectronic substrate and a ground end configured to electrically interconnect with a ground.

3. A system according to claim 1, wherein said base is formed of ceramic material.

4. A system according to claim 1, wherein said base is formed of polymer material.

5. A system according to claim 1, wherein said base is configured to removably secure a plurality of microelectronic substrates.

6. A system according to claim 1, further comprising at least one heat sink for overlying selective portions of at least one microelectronic substrate secured within said chamber.

7. A system for reducing arcing and localized heating during microwave processing of a workpiece, said system comprising:

a chamber including means for generating microwave energy;

a substantially microwave-transparent base for removably securing the workpiece thereto, said base including at least one internal bore sized and configured to receive an electrical conductor, said bore having a workpiece end located to provide the electrical conductor to the workpiece, and a ground end opposite the workpiece end for providing the electrical conductor to ground; and an electrical conductor having a workpiece end configured to electrically interconnect the workpiece and a ground end configured to electrically interconnect with a ground connected to said chamber.

8. A system according to claim 7, wherein said base further comprises a plurality of internal bores and a plurality of electrical conductors, each extending through a respective one of said plurality of internal bores and having a workpiece end configured to electrically interconnect with the workpiece and a ground end configured to electrically interconnect with a ground.

9. A system according to claim 7, wherein said base is formed of ceramic material.

10. A system according to claim 7, wherein said base is formed of polymer material.

11. A system according to claim 7, wherein said base is configured to removably secure a plurality of workpieces.

12. A system according to claim 1, further comprising at least one heat sink for overlying selective portions of at least one workpiece secured within said chamber.

13. A system according to claim 7, wherein said base further comprises a microwave-absorbent mass positioned on said base so that a predetermined portion of the workpiece overlies said mass when the workpiece is secured to said base.

14. A system according to claim 7, wherein said base further comprises a pin having a tip and extending from said base so that said tip is in adjacent relationship to a predetermined portion of the workpiece when the workpiece is secured to said base, and a ground end opposite from said tip, electrically interconnected with the electrical conductor.

* * * * *

UNITED STATES PATENT AND TRADEMARK OFFICE
CERTIFICATE OF CORRECTION

PATENT NO. : 5,750,968
DATED : May 12, 1998
INVENTOR(S) : Zakaryae Fathi, Richard S. Garard, Jianghua Wei It is certified that error appears in the above-identified patent and that said Letters Patent is hereby corrected as shown below:

ON THE TITLE PAGE:
   Item [75]

Inventors: Richard S. Gerard should read -- Richard S. Garard--

Item [56]
Under "Foreign Patent Documents" add the following:

3737248A1  5/88  Germany
1000358A7  11/88  Belgium
2555188  11/83  France

Under "Other Publications": Add the following publication:

--International Search Report for PCT/US 96/11040--

Column 10, Line 50 claim 1, should read -- claim 7,--

Signed and Sealed this

Twenty-ninth Day of September, 1998

Attest:

BRUCE LEHMAN

Attesting Officer      Commissioner of Patents and Trademarks